United States Patent
Yu et al.

(10) Patent No.: US 7,178,117 B1
(45) Date of Patent: Feb. 13, 2007

(54) APPARATUS AND METHOD FOR RTL BASED FULL CHIP MODELING OF A PROGRAMMABLE LOGIC DEVICE

(75) Inventors: Zunghang Yu, Sunnyvale, CA (US); Ninh Ngo, San Jose, CA (US); Guy Dupenloup, Redwood City, CA (US)

(73) Assignee: Altera Corporation, San Jose, CA (US)

( * ) Notice: Subject to any disclaimer, the term of this patent is extended or adjusted under 35 U.S.C. 154(b) by 170 days.

(21) Appl. No.: 10/821,466

(22) Filed: Apr. 8, 2004

(51) Int. Cl.
*G06F 17/50* (2006.01)
*G06F 9/45* (2006.01)
*H03K 17/693* (2006.01)

(52) U.S. Cl. .................. 716/5; 716/1; 716/4; 716/16

(58) Field of Classification Search ................ 716/1–2, 716/4–7, 16, 18; 703/23
See application file for complete search history.

(56) References Cited

U.S. PATENT DOCUMENTS

| | | | | |
|---|---|---|---|---|
| 5,911,061 A | * | 6/1999 | Tochio et al. | ................ 703/23 |
| 6,651,225 B1 | * | 11/2003 | Lin et al. | ........................ 716/4 |
| 2004/0268288 A1 | * | 12/2004 | Bajuk et al. | ................. 716/16 |

* cited by examiner

*Primary Examiner*—Paul Dinh
*Assistant Examiner*—Suresh Memula

(57) ABSTRACT

An RTL representation for a LAB is generated. A full chip RTL model is then generated using a plurality of the LAB RTLs. Using the full chip RTL model, a full chip simulation of the PLD chip is performed to verify and debug the electronic design.

15 Claims, 10 Drawing Sheets

APPARATUS AND METHOD FOR RTL BASED FULL CHIP MODELING OF A PROGRAMMABLE LOGIC DEVICE

BACKGROUND OF THE INVENTION

This invention relates generally to tools for computer-aided verification engineering. More specifically, the present invention relates to a technique for logic design verification using register transfer language (RTL).

Electronic design automation ("EDA") is becoming increasingly complicated and time consuming, due in part to the greatly increasing size and complexity of the electronic devices designed by EDA tools. Such devices include general purpose microprocessors as well as custom logic devices including programmable logic devices (PLDs) and ASICS.

A typical programmable logic device (PLD) contains many logic array blocks (LABs) arranged in a two-dimensional array. Additionally, PLDs have an array of intersecting signal conductors for programmably selecting and conducting logic signals to, from, and between the logic array blocks. LABs contain a number of programmable logic elements (LEs) which provide relatively elementary logic functions such as NAND, NOR, and exclusive OR. Each LAB also includes a plurality of programmable memory bits, i.e. configuration RAM bits ("CRAMs"), used to program the LAB. CRAM can be implemented as an EPROM, EEPROM, fuse, anti-fuse, SRAM, MRAM, FRAM, DRAM or the like.

Typically, the circuit designer uses EDA tools to initially design and subsequently test the operation of the design using computer simulation techniques. With reference to FIG. 1, a typical computer logic simulation technique proceeds by initially providing a logic design in the form of a schematic or netlist stored in a file 10 and converting the netlist by means of a logic compiler 12 into a simulator logic netlist 14 that is used by a logic simulator 15. During simulation, a set of simulation input vectors 16 is also provided to the logic simulator, which reads the simulator logic netlist 14, along with the simulator input vectors 16 and simulates the operation of the logic design by propagating logic levels through the logic primitives. Simulator 15 generates a set of output vectors 18, which are the simulated outputs of the logic design.

With increasing complexity and capacity of the devices, using a schematic level netlist for design simulation is time consuming. Additionally, with increasing complexity, debugging the design at the schematic level is not intuitive, thereby increasing the time required for debugging and making the debugging process cumbersome.

Consequently, there is a need in the art for a design tool that will allow for faster simulation times and also allow for a more intuitive approach to debugging the design.

SUMMARY OF THE INVENTION

The present invention is directed to a design simulation technique that uses RTL to simulate and debug an electronic design.

A programmable logic device is partitioned into a plurality of logic array blocks (LABs). An RTL representation for a LAB is generated. The RTL representation of the LAB is then logically compared with its schematic representation to ensure that the RTL representation is logically equivalent to the schematic. A full chip simulation of the PLD is then performed to verify and debug the electronic design.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

The present invention uses a modular approach for design simulation and verification. A programmable logic device chip is partitioned into a plurality of logic array blocks ("LAB"s). Preferably, the LABs are substantially identical to each other. However, the routing connections from one LAB to another depend on the circuit design and will usually differ depending on the location of the LAB on the chip.

An RTL model of one of the plurality of LABs is generated. This model is verified against the schematic level representation to ensure that the two are logically equivalent. After generating a logically equivalent RTL representation of the LAB, full chip verification in RTL is then performed for the entire chip.

Module Partition

Figure 1:
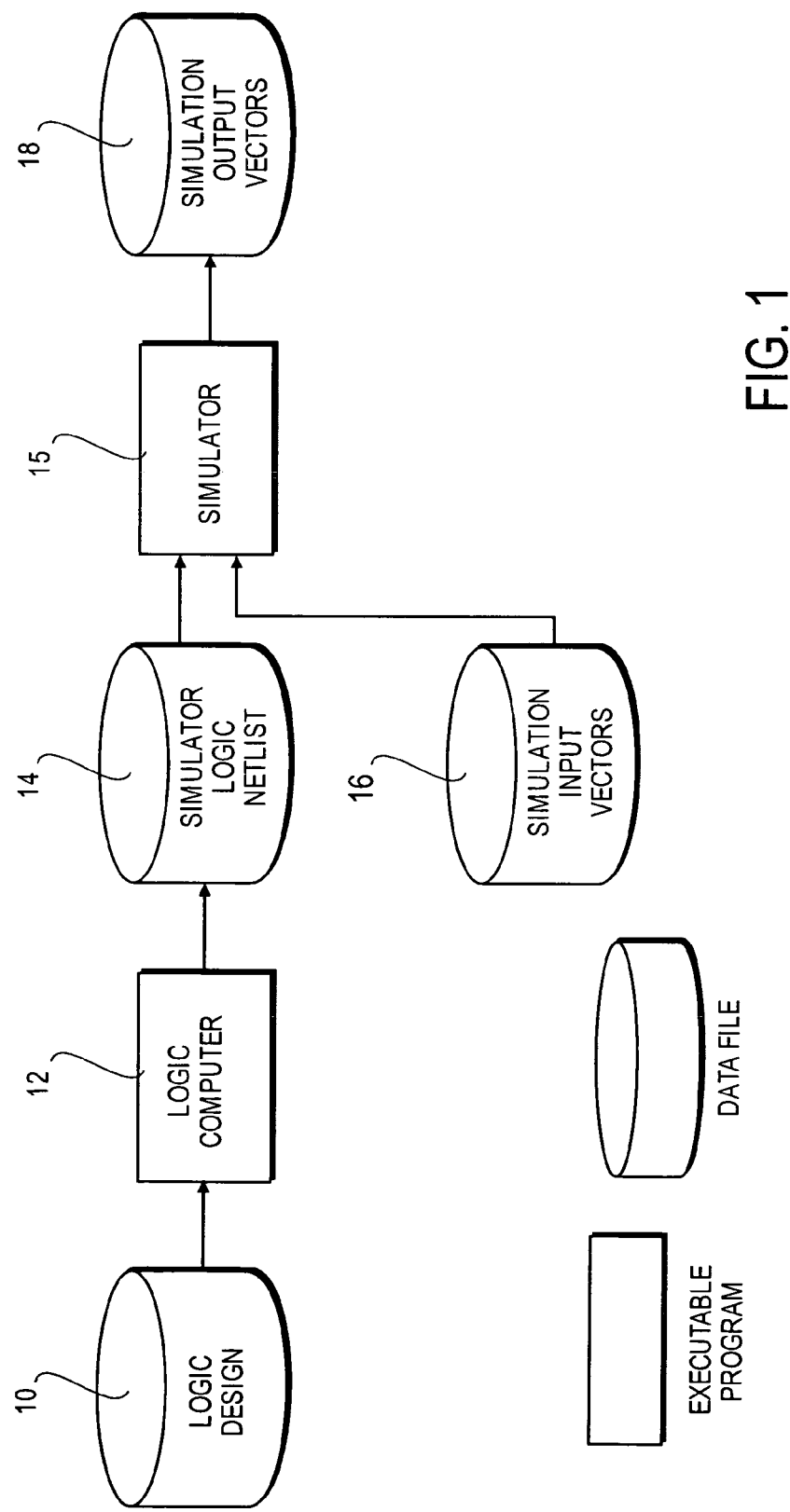
FIG. 1 is a schematic diagram illustrating a computer logic simulation system.
Figure 2:
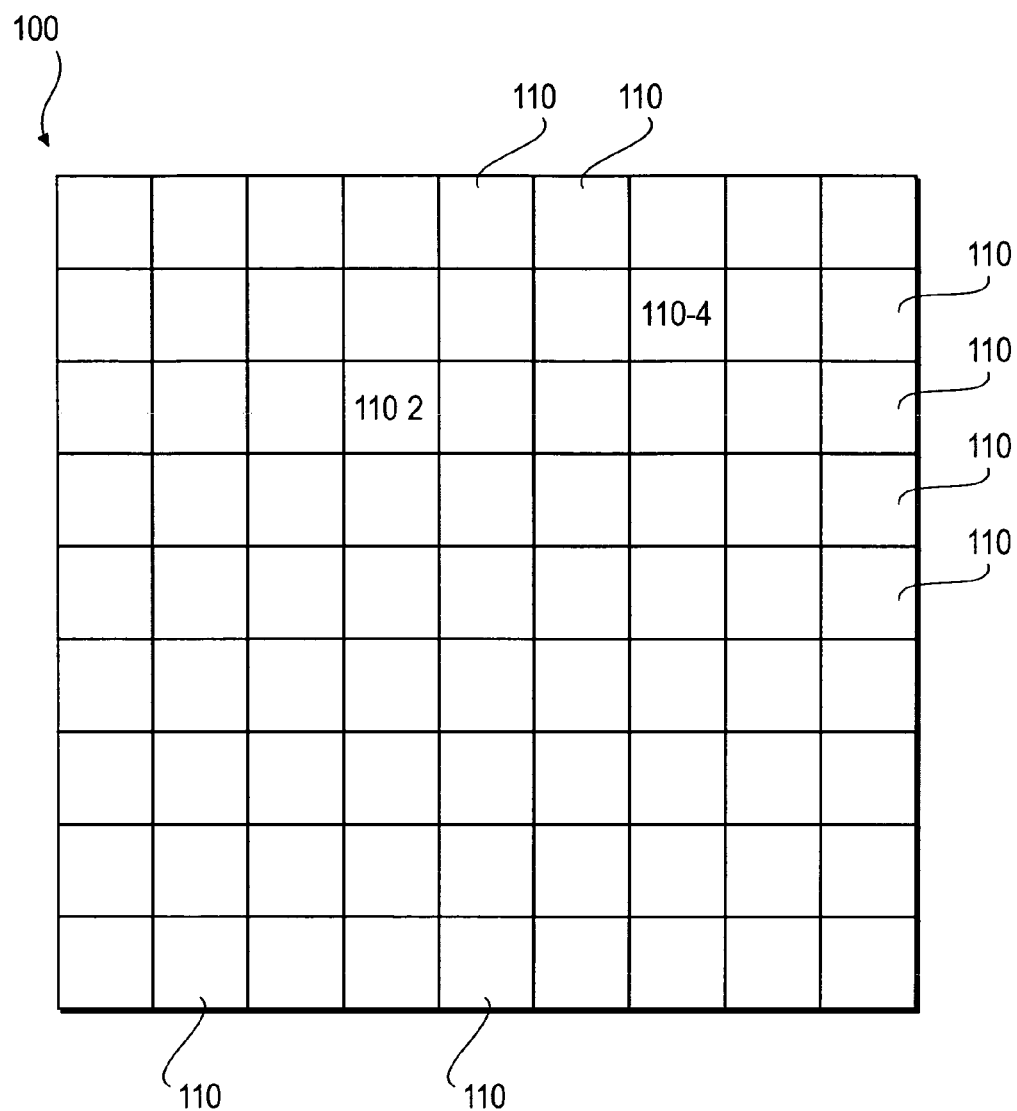
FIG. 2 illustrates a schematic overview of a programmable logic device chip incorporating the present invention.

FIG. 2 illustrates a schematic overview of a programmable logic device chip 100 incorporating the present invention. As used herein PLDs include complex PLDs ("CPLDs"), programmable array logic ("PALs"), programmable logic arrays ("PLAs"), field PLAs ("FPLAs"), erasable PLDs ("EPLDs"), electrically erasable PLDs ("EEPLDs"), logic cell arrays ("LCAs"), field programmable gate arrays ("FPGAs"). Additionally, the techniques of the present invention can be used with other types of integrated circuits having a programmable portion, such as an ASIC with an embedded PLD.

Device 100 is partitioned into an array of LABs 110 arranged in horizontal rows and vertical columns. Please note that LABs are used herein for illustrative purposes only. The techniques of the present invention may be used for other types of programmable blocks, e.g. IO, DSP, memory, etc.

The LABs 110 are substantially identical to each other, however, the port connectivities of a LAB in the full-chip may vary depending on the function it will perform and its location on the chip. A LAB 110 is modeled using RTL and is subsequently used for full chip verification. The array shown in FIG. 2 is for illustrative purposes only, the LABs may be partitioned in other configurations that may occur to one skilled in the art.

Figure 3:
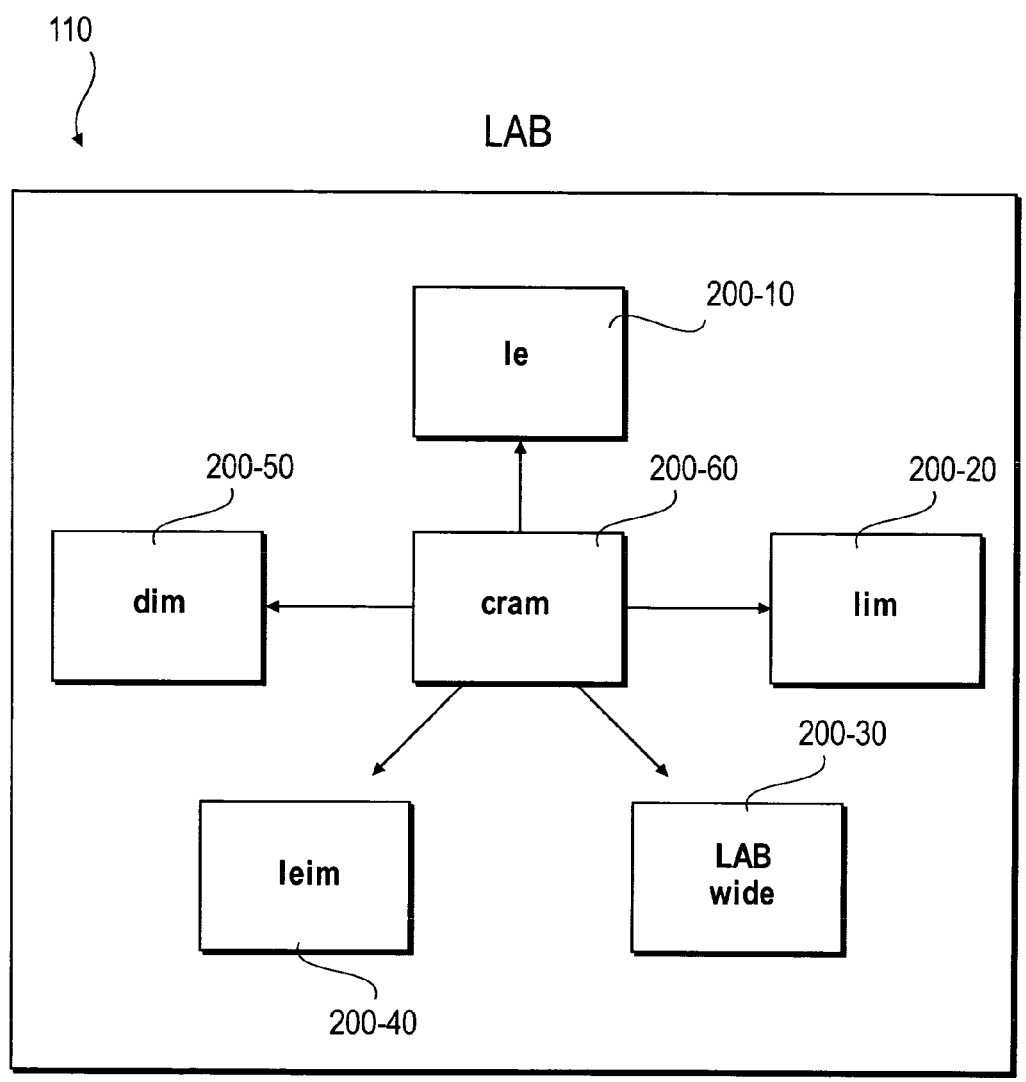
FIG. 3 illustrates the components of a logic array block ("LAB") of the plurality of LABs shown in FIG. 2.

FIG. 3 illustrates components of one of the LABs 110 of the plurality of LABs shown in FIG. 2. Each LAB 110 includes a plurality of sub-blocks 200 including logic elements (le) 200-10, LAB line input muxes (lim) 200-20, Lab wide input control signals (LAB wide) 200-30, logic element input muxes (leim) 200-40, and driver input muxes (dim) 200-50. LEs 200-10 are the basic building blocks of a programmable logic device and are used to perform a variety of basic logic operations. Lims 200-20 are the input muxes into the LAB. LAB wide 200-30 generates the control signals within the LAB 110. Leims 200-40 are the LE input muxes for each LE. And dims 200-50 are the drivers for the LAB outputs to circuitry outside the LAB 110. Each of the components 200 is controlled by one or more CRAMs. Block 200-60 comprises the CRAMs used to control the components 200.

LAB 110 may include additional electronic circuitry not shown here. Additionally, LAB 110 may include a plurality of each of the components 200-10 through 200-50. The plurality of components 200-10 through 200-50 are not necessarily identical to each other. For example, LAB 110 may include two or more lim sub-blocks 200-20. The two or more lim sub-blocks need not be identical to each other.

Cram Bit Array

Figure 4:
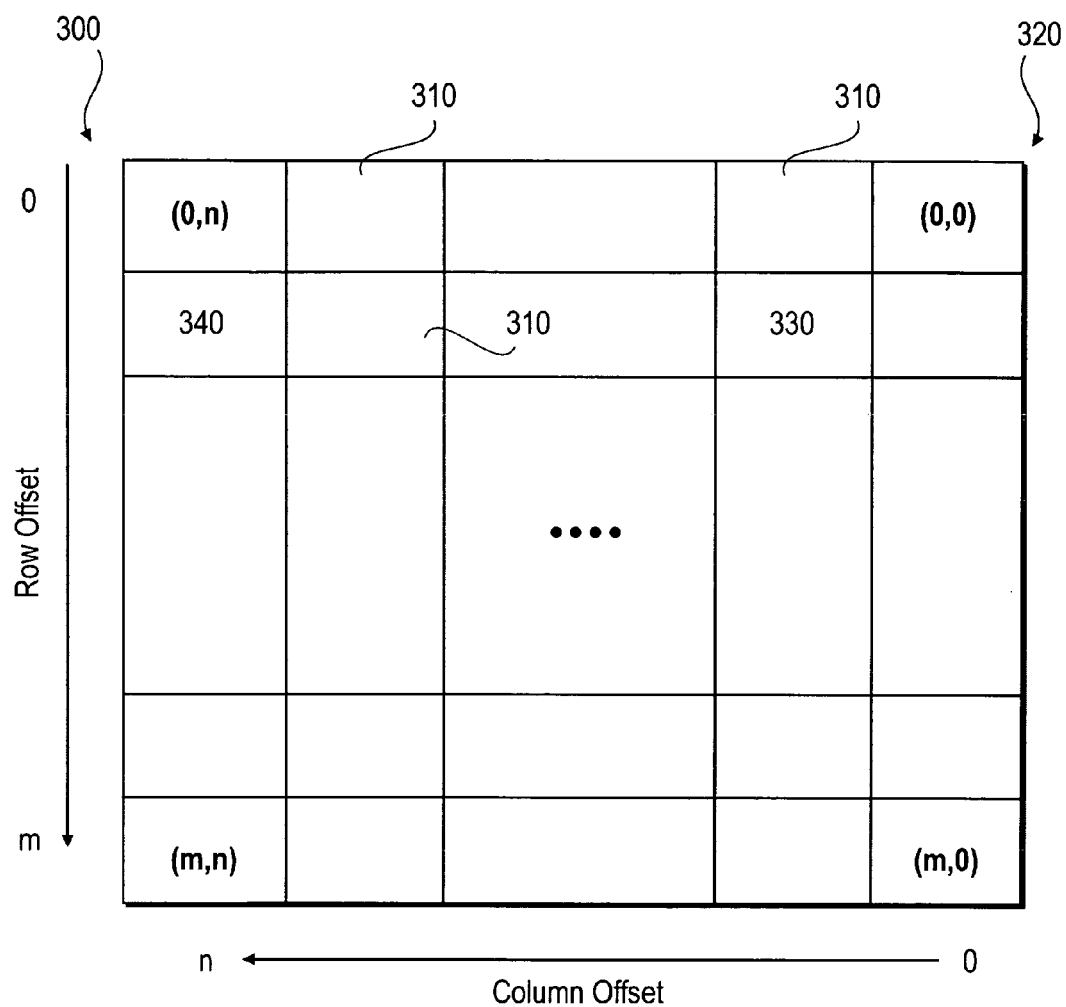
FIG. 4 illustrates a typical LAB CRAM array of the chip in FIG. 2 in accordance with the invention.

FIG. 4 illustrates a LAB CRAM array associated with the CRAM block of the LAB 110 in accordance with the invention. All CRAM bits associated with a LAB 110 are processed in a separate block 200-60 (see FIG. 3). Block 200-60 comprises the CRAM bits used to program LAB block 110. For coding flexibility, CRAM bits 310 are named based on their functions. The CRAM bits can either be mapped into individual bits in a memory array 300 or programmed through address and data lines. Array 300 includes the starting and the offset values for the CRAM bits in block 200-60. The absolute coordinates (A, B) in the memory array 300 are determined from the starting point 320 of a LAB plus the offset within the LAB.

The starting point for a LAB is determined from its location on the chip 100. For example, the starting coordinates for LAB 110-2 (FIG. 2) are [2m, 5n] where m is the number of rows of memory bits in a LAB and n is the number of columns of memory bits in the LAB. The starting coordinates for LAB 110-4 (FIG. 2) are [1m, 2n]. Preferably, m and n are the same for each LAB 110 in chip 100.

The offset is determined from the bits' location within the array 300 and is associated with the bits' location in block 200-60. The offset values for block 330 are (1,1) and the offset values for block 340 are (1,n). If the array 300 represents LAB 110-2 then the absolute values for block 330 will be (2m+1, 5n+1) and the absolute values for block 340 will be (2m+1, 5n+n).

The main purpose of the CRAM module generation is to give each CRAM bit with a unique meaningful name and a physical location in the memory array. By providing a unique meaningful name, the CRAM bit can be referenced in RTL code by its functional name without the need for specifying its physical location.

Cram Module Generation

Figure 5:
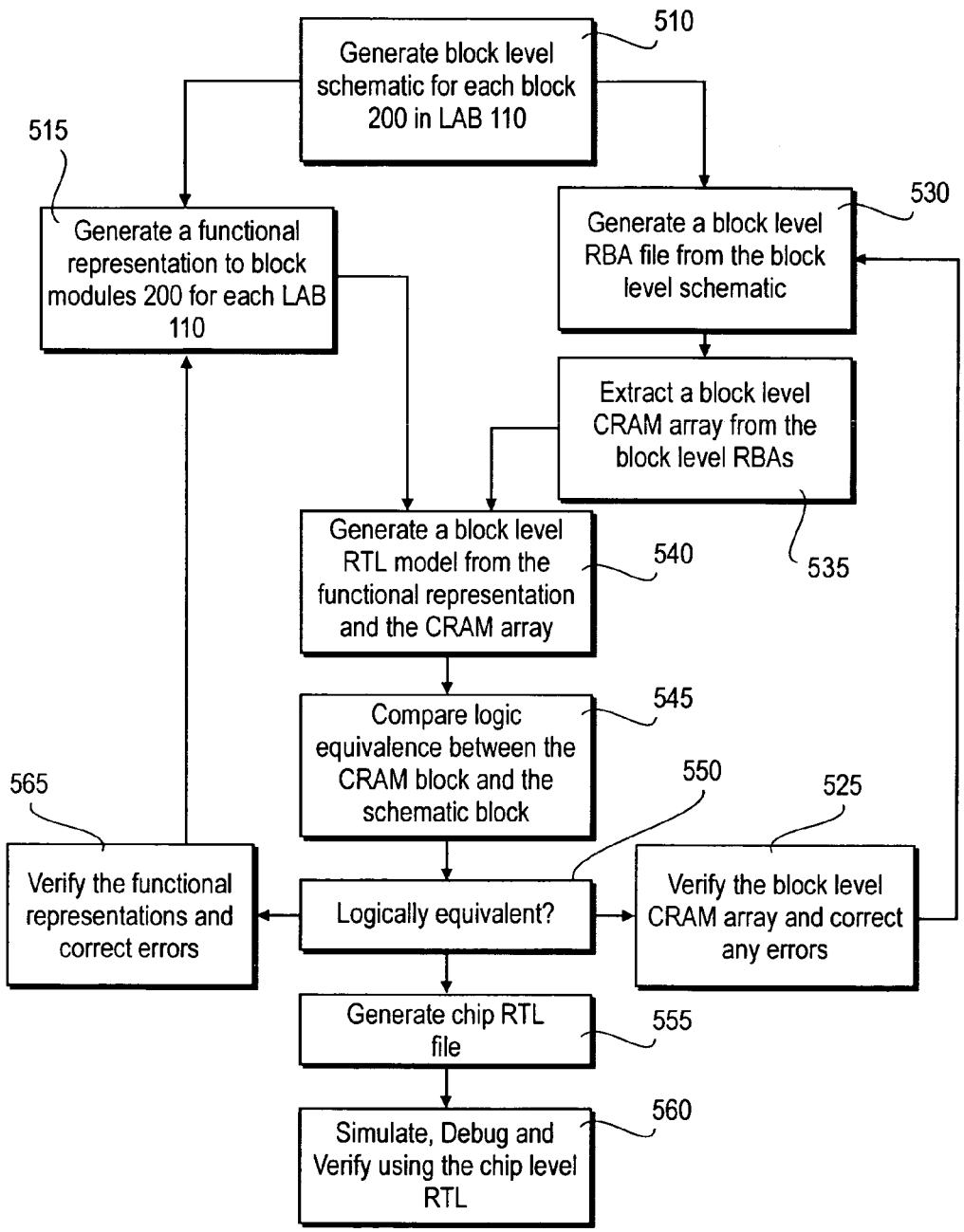
FIG. 5 shows a modeling process flow for simulating the chip of FIG. 2 in connection with the present invention.

FIG. 5 shows a modeling process flow for the simulation and verification of the chip 100 of FIG. 2 in connection with the present invention. In step 510 a block level schematic of the design is generated. The block level schematic corresponds to block 110 shown in FIG. 2. In step 515 a functional representation of each module 200 in LAB 110 is generated from the block level schematic generated in step 510. This functional representation is then used to generate a block level RTL in step 540.

Additionally, in step 530, a block level Ram Bit Address (RBA) file is generated from the block level schematic of step 510. A Ram Bit Address (RBA) file contains both the location and functionality of the CRAM bit. In step 535, a block level CRAM array 300 (FIG. 3) is extracted from the block level RBA file of step 530. This block CRAM array and the functional representations generated in step 515 are instantiated in the LAB RTL in step 540 to generate a LAB RTL file. In step 545, this LAB RTL file is used to compare the logic equivalence between the block level RTL model and the block level schematic.

In other embodiments, the block level RBA file is extracted from a full chip RBA file. In these embodiments, a full chip schematic is generated from the block level schematic and a full chip RBA file is generated from the full chip schematic. This full chip RBA file is then used to extract the block level RBA file of step 530.

If, in step 545, the block level RTL model and the block level schematic are logically equivalent then a full chip RTL is generated in step 555. This full chip RTL file is then used to simulate, debug and verify the design in step 560. If, in step 550, the two files are not logically equivalent, then in step 565, the functional representation is verified and modified to correct for any errors that may have been introduced in generating the functional representation. Additionally, in step 525, the CRAM array is verified and modified to correct for any errors that may have been introduced in generating the RTL model. Steps 540 through 560 are then repeated again using the modified RTL model.

Figure 6:
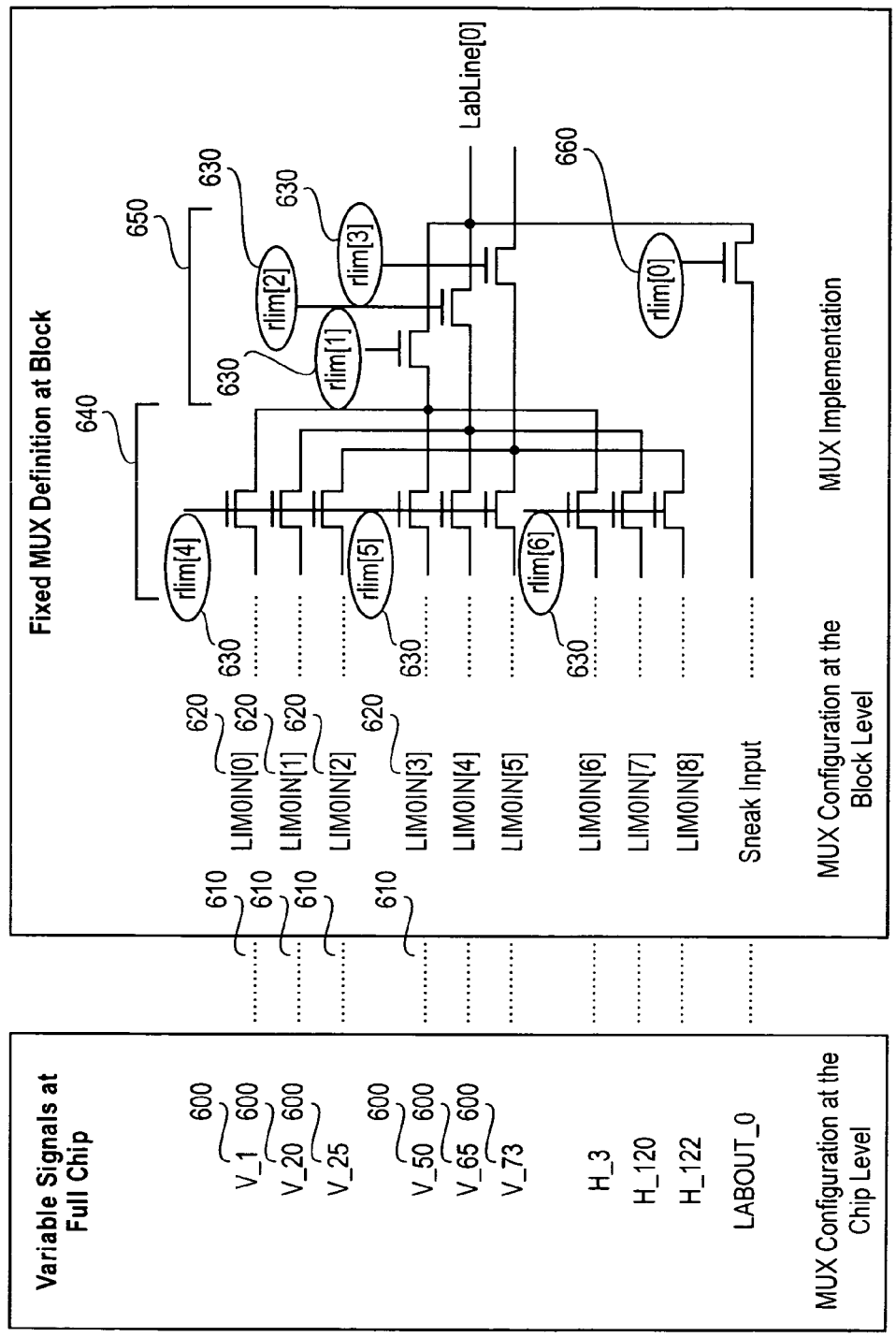
FIG. 6 shows a schematic diagram illustrating the naming of CRAM bits in accordance with an embodiment of the invention.

FIG. 6 shows a schematic diagram illustrating naming of CRAM bits in accordance with an embodiment of the invention. The naming of bits for FIG. 6 is for illustrative purposes only. The naming of bits for other schematics will vary depending on their function and input/outputs. FIG. 6 shows a lim block 200-20. Lim block 200-20 includes inputs 610, a first stage mux 640, and a second stage mux 650.

Inputs 610 connect to signals 600 at chip level. Signals 600 are from horizontal and vertical routing wires. Signals 600 from the horizontal and vertical routing wires are connected to the MUX inputs 620 at the chip level. The MUX input signals 600 are not necessarily the same for each LAB 110 in PLD device 100. Connections 610 may be used to connect the block inputs, outputs or both to other LABs 110 on the chip 100. For example, in other blocks 200, i.e. dim block 200-50, connections 610 connect the MUX outputs 620 to horizontal and vertical routing wires 600. Connections 610 may be modified as the chip goes through simulation, verification, routing optimization, and debugging.

The first stage mux 650 may have anywhere from 3–11 programming bits. The second stage mux 640 for a lim usually has 3 programming bits. All lim blocks 200-20 have a sneak input ram bit 660. Preferably, the first and second stage muxes comprise 3 programming bits each. The number of muxes and the number of programming bits are not necessarily the same for each sub-block 200 of LAB 110.

For a given block mux inputs/outputs 620 are fixed and uniform, i.e. LIMOIN[8:0] plus one sneak input for block 200-20. From this regularity, we can define rules on how to name the CRAM bits 630. The RTL code that implements the logic function of the LAB follows the same naming convention.

For the case in FIG. 6, seven CRAM bits are created, rlim[6:0], bit 0 for the sneak input, bits 1 to 3 for the second stage MUX and bit 4 to 6 from the first stage mux. The row and column offsets of these CRAM bits are extracted from the block RBA file.

Figure 7:
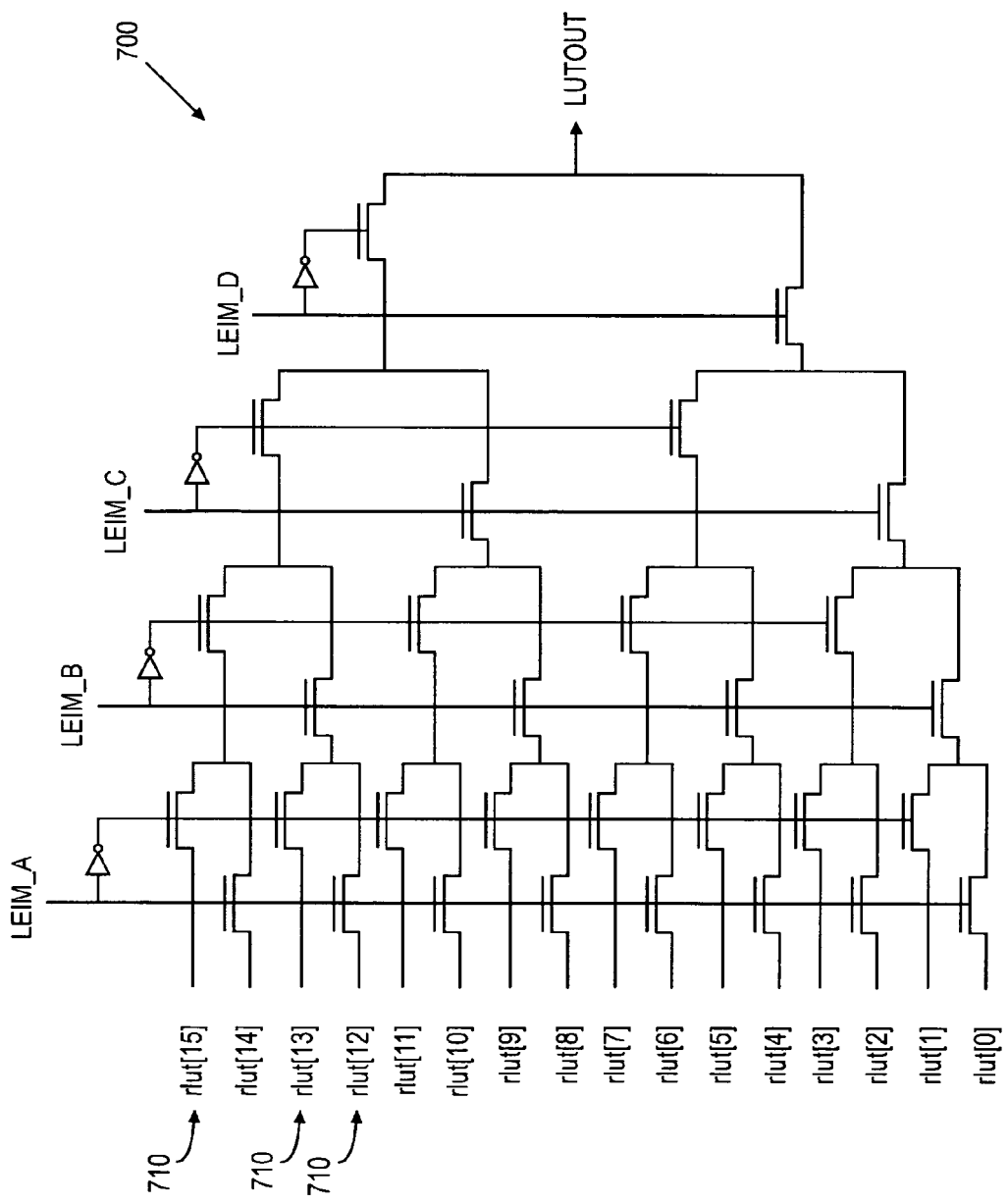
FIG. 7 shows a second schematic diagram illustrating the naming of CRAM bits in accordance with an embodiment of the invention.

FIG. 7 shows a second schematic diagram illustrating naming of CRAM bits in accordance with an embodiment of the invention. FIG. 7 shows the schematic for a look-up table (LUT) 700 in an LE block 200-10. For this portion of the LE block, the programming bits 710 are named 0–15, one for each input to the LUT. The number of inputs to the LUT varies depending on the size of the LUT. The number of bits per LUT will also vary and will be equal to the number of inputs to the LUT. Also, the input signals may not necessarily be the same for each LE block 200-10 in LAB 110 and the inputs may also vary from one LAB 110 to another LAB 110 depending on the location and function of the LAB.

RTL Modeling

With the right module partition and automated CRAM module creation, different modeling techniques can be explored to achieve optimum simulation performance. Described below are 3 exemplary modeling techniques. Other simulation techniques in addition to the ones discussed below may be used in conjunction with the present invention.

Behavioral 2-D Memory Model

Figure 8:
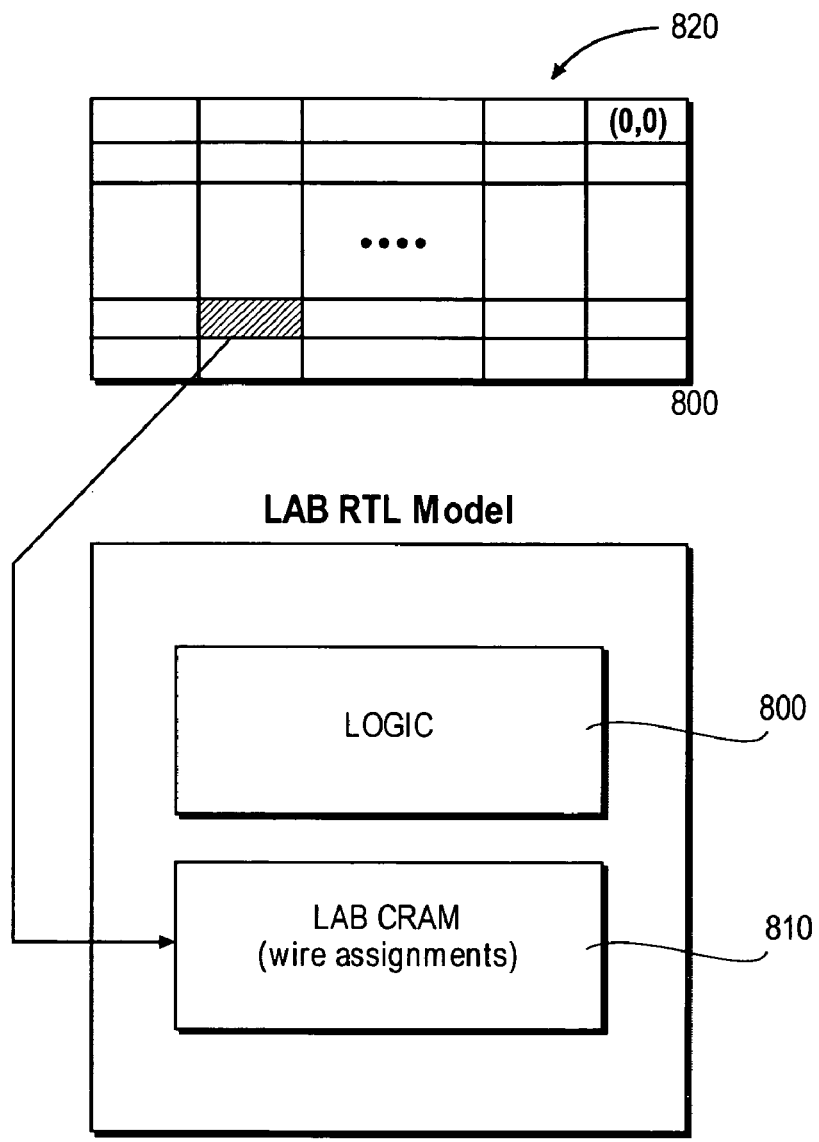
FIG. 8 shows a graphical illustration of the Behaviorial 2-D modeling technique that may be used in accordance with the present invention.

FIG. 8 shows a graphical illustration of the behavioral 2-D modeling technique that may be used in accordance with the present invention. Here LAB 110 (FIG. 2) model is instantiated using the full chip CRAM array 820. Full chip CRAM array 820 comprises the memory bit information for each LAB 110 in chip 100. Logic 800 includes the blocks 200 (FIG. 3) for each LAB 110, e.g. Les, lims, leims, dims and Lab wides. LAB CRAM 810 contains the memory bit information for LAB 110. LAB CRAM 810 extracts the absolute coordinates and bit values from CRAM array 820 and uses these coordinates to initialize the 2-D CRAM array 810. Individual CRAM bits are then assigned to a location in the array:

rlim[0]=cram–array[bdata+0][badd+14]

where bdata and badd are the starting points for the LAB. In this model, no read or write operation to the CRAM memory array is supported since the address and data lines are not modeled. This model is useful for simulations where CRAM programming is not part of the verification process, i.e. Programmer Object File ("POF") simulation. A programmer object file contains the configuration data for a programmable logic device. Generally the data is in binary format and is downloaded into a programmable logic device upon start-up.

Functional Cram Model

Figure 9:
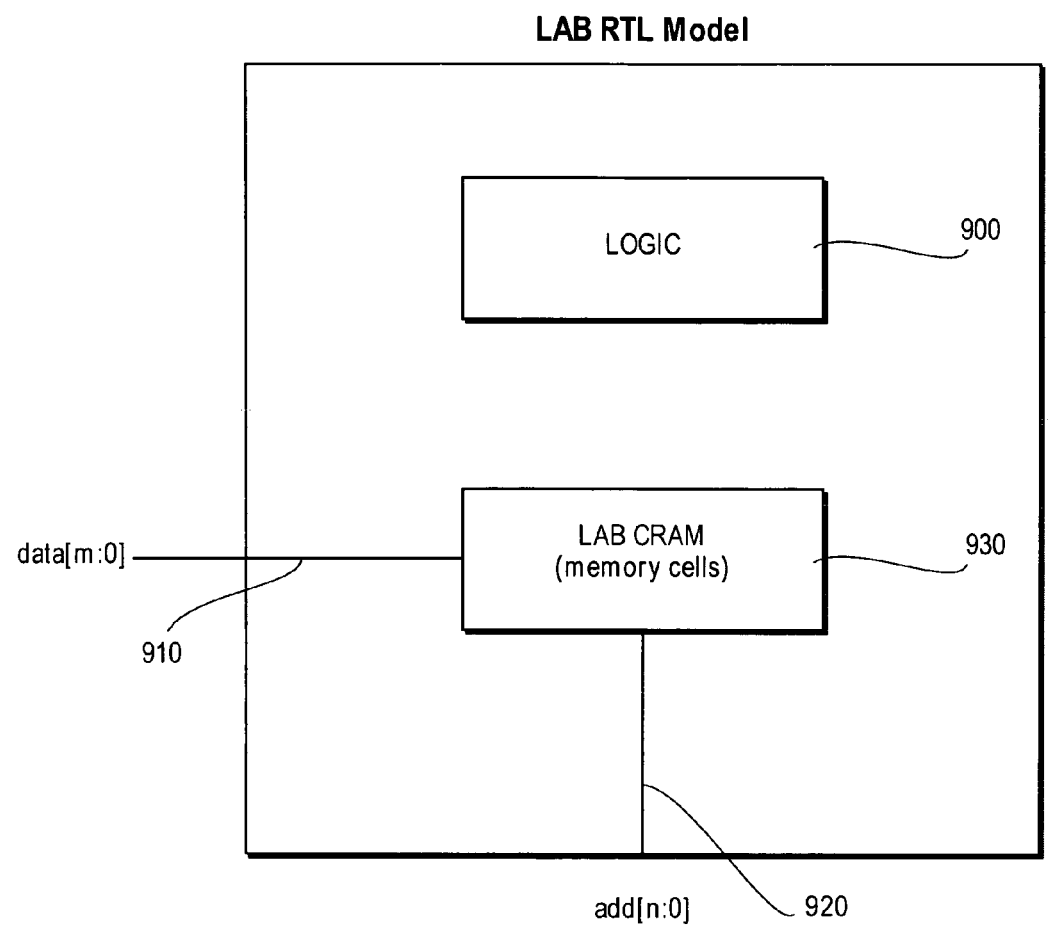
FIG. 9 shows a graphical illustration of the Functional CRAM modeling technique that may be used in accordance with the present invention.

FIG. 9 shows a graphical illustration of the Functional CRAM modeling technique that may be used in accordance with the present invention. In this model, the absolute coordinates and bit values are obtained from the data[m:0] 910 and add[n:0] 920 lines. Logic 900 includes the blocks 200 for each LAB 110, e.g. Les, lims, leims, dims and Lab wides. In this technique, global address 920 and data 910 lines are connected to the LAB CRAM 930. The CRAM 930 is programmed to the value of the data line when the address line is high. Each CRAM bit is a module instance:

cram_cell cram__0__14 (.add(add[badd+14]),.data (data[bdata+0]),.clear(clear))

where bdata and badd are the starting points for the LAB. In this technique the CRAM array, address and data lines are modeled. This modeling technique preserves full functionality and is therefore useful for full configuration verification.

Functional 2-D Memory Model

Figure 10:
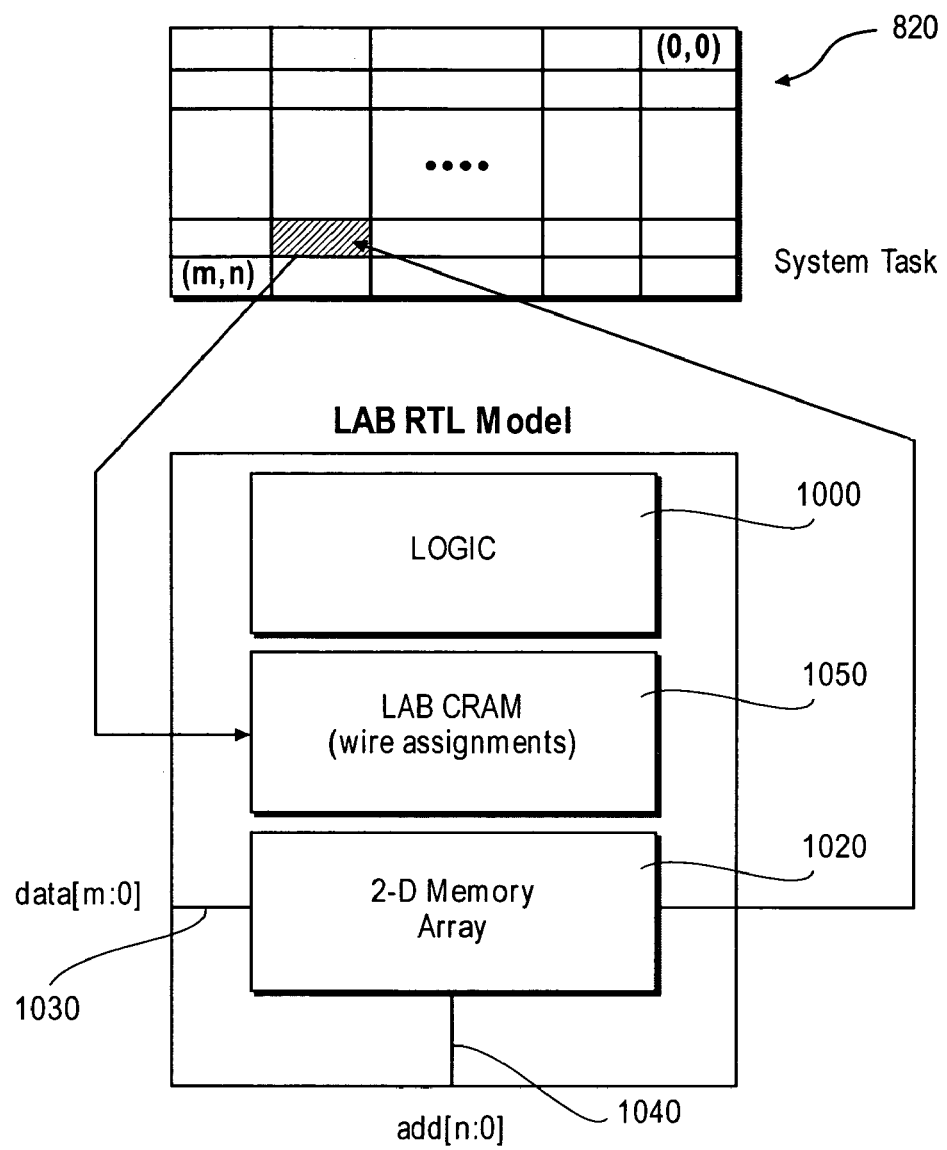
FIG. 10 shows a graphical illustration of the Functional 2-D modeling technique that may be used in accordance with the present invention.

FIG. 10 shows a graphical illustration of the Functional 2-D modeling technique that may be used in accordance with the present invention. CRAM bit array block 300 comprises the CRAM array for each LAB 110 in chip 100. Logic 1000 includes the blocks 200 for each LAB 110, e.g. Les, lims, leims, dims and Lab wides. 2-D Memory Array 1020 obtains the absolute coordinates and bit values from the data[m,0] 1030 and add[n,0] 1040 lines.

Here, the CRAM array can be initialized either through write operations from the address and data lines, 1030 and 1040 or through a system task call. When the address and data lines are used to initialize the array, the memory bit information received from the address and data lines, 1040 and 1030, are used to populate the CRAM array 300. CRAM block 1050 then accesses the memory bit information from array 820. Individual CRAM bits are then assigned to a location in the array:

rlim[0]=cram–array[bdata+0][badd+14]

where bdata and badd are the starting points for the LAB.

This model can be used for configuration verification, when the array is initialized through the write operations. This model can also be used for POF verification when the array is initialized using a task command.

The three simulations techniques discussed above were compared to determine the technique that would be most useful. The results are shown in Table 1 below. As can be seen, the FUNCTIONAL CRAM MODEL (case b) uses almost twice as much memory as the other two modeling techniques. The BEHAVIORAL 2-D MEMORY MODEL (case a) uses the least memory but has limited applicability since it can only be used for POF verification. For these reasons, the FUNCTIONAL 2-D MEMORY MODEL (case c) is preferred because it provides for both POF and configuration verification with only a small increase in the amount of memory required to perform the verification.

TABLE 1

|  | Compile Memory (Mb) | Simulation Memory (Mb) | Compile Time (sec) | Run Time (sec) |
| --- | --- | --- | --- | --- |
| Case (a) | 1698 | 1240 | 63 | 60 |
| Case (b) | 1740 | 2910 | 65 | 68 |
| Case (c) | 1701 | 1466 | 64 | 65 |

The foregoing description of specific embodiments of the invention has been presented for the purposes of illustration and description. It is not intended to be exhaustive or to limit the invention to the precise form described. Many modifications and variations are possible in light of the teachings above. The embodiment were chosen and described in order to best explain the principles of the invention and its practical applications to thereby enable others skilled in the art to best utilize the invention in various embodiments and with various modifications as are suited to the particular use contemplated.

We claim:

1. A method of verifying a full-chip electronic design of a programmable logic device (PLD) chip, the method comprising:
   partitioning the PLD chip into a plurality of blocks;
   generating a block level RTL model of one of the plurality of blocks, wherein generating a block level RTL comprises:
      creating a block level schematic of an electronic design;
      extracting a block Ram Bit Address (RBA) file from the block level schematic;
      extracting a block level CRAM array from the block level RBA file; and
      generating the block level RTL using the block level CRAM array;
   generating a block level functional representation of the one of the plurality of blocks;
   producing a full chip RTL model using the block level RTL model and the block level functional representation; and
   using the full chip RTL model for verification, simulation or debugging.

2. The method of claim 1 wherein at least a portion of the PLD chip is partitioned into a plurality of rows and columns of logic array blocks (LABs).

3. The method of claim 2 wherein the LAB comprises a plurality of one or more of the following sub-blocks: LE, LIM, LAB wide, LEIM, CRAM and DIM.

4. The method of claim 1 wherein the block level CRAM array comprises absolute coordinates and RAM bit values for each CRAM bit.

5. The method of claim 4 wherein the CRAM comprises at least one of EPROM, EEPROM, fuse, anti-fuse, SRAM, MRAM, FRAM, or DRAM.

6. The method of claim 1 further including:
   comparing the block level RTL model to the block level schematic before producing a full chip RTL model; and
   modifying the block level functional representation and the block level CRAM array if the block level RTL is not equivalent to the block level schematic.

7. The method of claim 1 wherein the PLD is a complex programmable logic device ("CPLD"), programmable array logic ("PAL"), programmable logic array ("PLA"), field PLA ("FPLA"), erasable PLD ("EPLD"), electrically erasable PLD ("EEPLD"), logic cell array ("LCA") or field programmable gate array ("FPGA").

8. The method of claim 1 wherein the programmable logic device is embedded into an electronic device.

9. The method of claim 8 wherein the electronic device comprises programmable and non-programmable circuitry.

10. The method of claim 1 wherein one or more of the plurality of blocks comprise digital signal processing blocks, input/output blocks, or memory blocks.

11. A data processing system for verifying a full-chip electronic design of a programmable logic device (PLD) chip, the data processing system including instructions for implementing the method of claim 1.

12. A method of verifying a full-chip electronic design of a programmable logic device (PLD) chip, the method comprising:
   partitioning the PLD chip into a plurality of blocks;
   generating a block level RTL model of one of the plurality of blocks, wherein generating a block level RTL comprises:
      creating a block level schematic of an electronic design;
      generating a full chip schematic using a plurality of the block level schematics;
      producing a full chip RBA file from the full chip schematic;
      extracting block level RBA file from the full chip RBA file;
      extracting a block level CRAM array from the block level RBA file; and
      generating a block level RTL model using the block level CRAM array;
   generating a block level functional representation of the one of the plurality of blocks;
   producing a full chip RTL model using the block level RTL model and the block level functional representation; and
   using the full chip RTL model for verification, simulation or debugging.

13. The method of claim 12 wherein the block level CRAM array comprises absolute coordinates and RAM bit values for each CRAM bit.

14. The method of claim 13 wherein the CRAM comprises at least one of EPROM, EEPROM, fuse, anti-fuse, SRAM, MRAM, FRAM, or DRAM.

15. A method of verifying a programmable region of an electronic design, the method comprising:
   partitioning the programmable region into a plurality of blocks;
   generating a block level RTL model of one of the plurality of blocks wherein generating a block level RTL comprises:
      creating a block level schematic of an electronic design;
      extracting a block Ram Bit Address (RBA) file from the block level schematic;
      extracting a block level CRAM array from the block level RBA file; and
      generating the block level RTL using the block level CRAM array;
   generating a block level functional representation of the one of the plurality of blocks;
   producing a full region RTL model from the block level RTL model and the block level functional representation; and
   using the full region RTL model for verification, simulation or debugging.

* * * * *

UNITED STATES PATENT AND TRADEMARK OFFICE
CERTIFICATE OF CORRECTION

PATENT NO. : 7,178,117 B1 Page 1 of 1
APPLICATION NO. : 10/821466
DATED : February 13, 2007
INVENTOR(S) : Yu et al.

It is certified that error appears in the above-identified patent and that said Letters Patent is hereby corrected as shown below:

TITLE PAGE (75) Inventor(s): Zunghang Yu should read Zunhang Yu.

Signed and Sealed this

Twenty-sixth Day of June, 2007

JON W. DUDAS
*Director of the United States Patent and Trademark Office*